(12) United States Patent
Tsukiyama et al.

(10) Patent No.: US 10,707,174 B2
(45) Date of Patent: Jul. 7, 2020

(54) SEMICONDUCTOR DEVICE HAVING LITHOGRAPHY MARKS AND RESIN PORTIONS IN A CUTTING REGION

(71) Applicant: TOSHIBA MEMORY CORPORATION, Tokyo (JP)

(72) Inventors: Satoshi Tsukiyama, Kanagawa (JP); Hideo Aoki, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/909,425

(22) Filed: Mar. 1, 2018

(65) Prior Publication Data

US 2019/0088601 A1    Mar. 21, 2019

(30) Foreign Application Priority Data

Sep. 15, 2017 (JP) ................. 2017-178416

(51) Int. Cl.
  *H01L 23/544* (2006.01)
  *H01L 23/31* (2006.01)
  *H01L 21/78* (2006.01)

(52) U.S. Cl.
  CPC ............ *H01L 23/544* (2013.01); *H01L 21/78* (2013.01); *H01L 23/3114* (2013.01); *H01L 2223/54426* (2013.01)

(58) Field of Classification Search
  CPC ......... H01L 23/544; H01L 2223/54426; H01L 2223/54453–54466; H01L 2223/54473–54486; H01L 23/28–3192; H01L 2223/544–54493
  See application file for complete search history.

(56) References Cited

U.S. PATENT DOCUMENTS

| 4,981,529 | A | * | 1/1991 | Tsujita | G03F 9/7076 148/33 |
| 7,459,768 | B2 | | 12/2008 | Ando | |
| 7,554,211 | B2 | * | 6/2009 | Kida | H01L 21/78 257/618 |
| 7,892,949 | B2 | | 2/2011 | Abe et al. | |
| 2001/0041425 | A1 | | 11/2001 | Ohsumi et al. | |
| 2003/0216009 | A1 | * | 11/2003 | Matsuura | H01L 23/544 438/460 |
| 2006/0138673 | A1 | * | 6/2006 | Kim | H01L 23/3192 257/779 |
| 2009/0243044 | A1 | * | 10/2009 | Tanaka | H01L 23/3171 257/618 |
| 2010/0007035 | A1 | * | 1/2010 | Shimada | H01L 23/544 257/792 |

(Continued)

FOREIGN PATENT DOCUMENTS

| JP | 2004-253678 A | 9/2004 |
| JP | 2005-183866 A | 7/2005 |
| WO | 2007/055270 A1 | 5/2007 |

*Primary Examiner* — Younes Boulghassoul
(74) *Attorney, Agent, or Firm* — Kim & Stewart LLP

(57) ABSTRACT

According to one embodiment, a semiconductor device includes a device region covered with a resin film and a dicing region extending along at least one side of the device region, the dicing region including at least a first lithography mark and a second lithography mark. The resin film includes a first dicing region portion which covers a portion of the dicing region between the first lithography mark and the second lithography mark.

5 Claims, 19 Drawing Sheets

(56) References Cited

U.S. PATENT DOCUMENTS

| | | | |
|---|---|---|---|
| 2010/0181650 A1* | 7/2010 | Shigihara | H01L 21/6836 257/620 |
| 2015/0255373 A1* | 9/2015 | Watanabe | H01L 23/481 257/48 |
| 2016/0027739 A1* | 1/2016 | Park | H01L 23/544 438/14 |
| 2016/0093533 A1* | 3/2016 | Yow | H01L 21/78 257/773 |
| 2017/0141044 A1* | 5/2017 | Kitajo | H01L 23/49827 |
| 2017/0148700 A1* | 5/2017 | Narita | H01L 21/78 |

\* cited by examiner

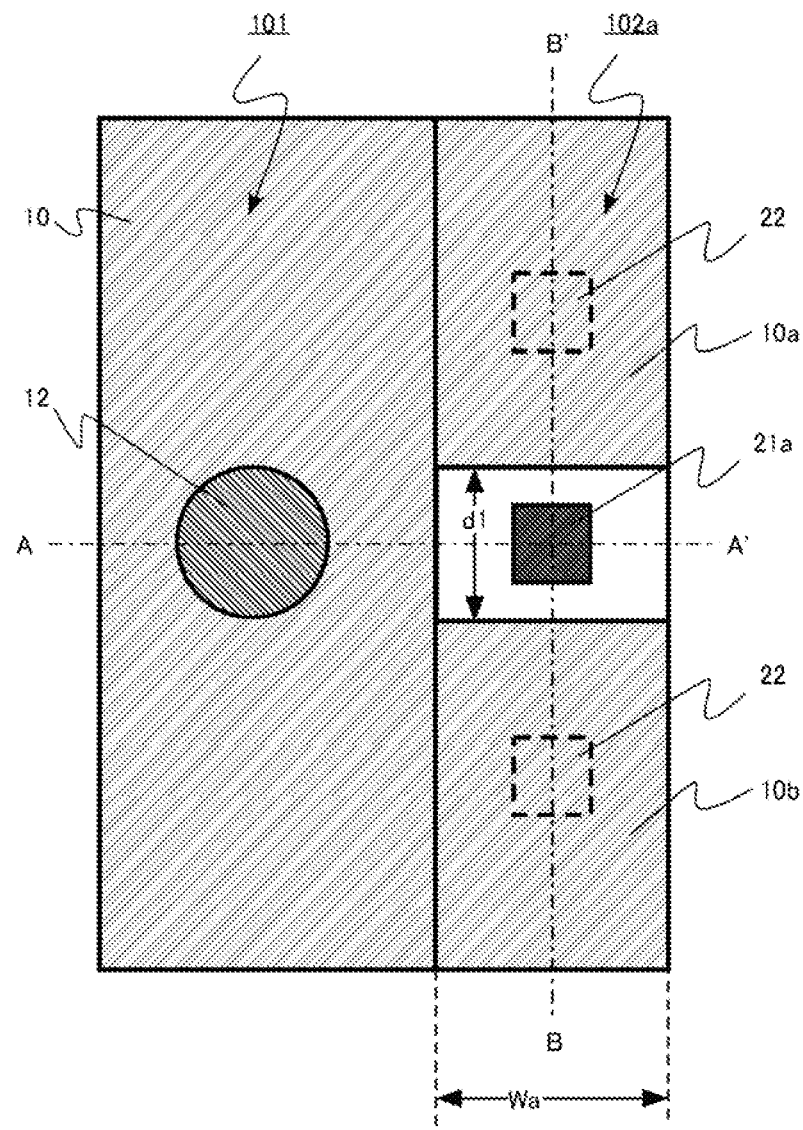

SEMICONDUCTOR DEVICE HAVING LITHOGRAPHY MARKS AND RESIN PORTIONS IN A CUTTING REGION

CROSS-REFERENCE TO RELATED APPLICATION

This application is based upon and claims the benefit of priority from Japanese Patent Application No. 2017-178416, filed Sep. 15, 2017, the entire contents of which are incorporated herein by reference.

FIELD

Embodiments described herein relate generally to a semiconductor device.

BACKGROUND

In a semiconductor device, a plurality of semiconductor chips are stacked on each other and a three-dimensional structure is provided. Using such a three-dimensional structure, miniaturization and high density of the semiconductor device can be achieved. The semiconductor chips, which are vertically stacked, are electrically connected to each other by, for example, a TSV (Through Silicon Via) provided in the semiconductor chip.

The TSV is formed at a wafer level, for example, before the semiconductor substrate is diced into individual chips. In order to achieve the semiconductor device of the three-dimensional structure at low cost, it is preferable to stably form the TSV in the semiconductor chip.

DESCRIPTION OF THE DRAWINGS

FIG. 2 is an enlarged schematic top view illustrating a part of the semiconductor device according to the first embodiment.

DETAILED DESCRIPTION

Figure 1:
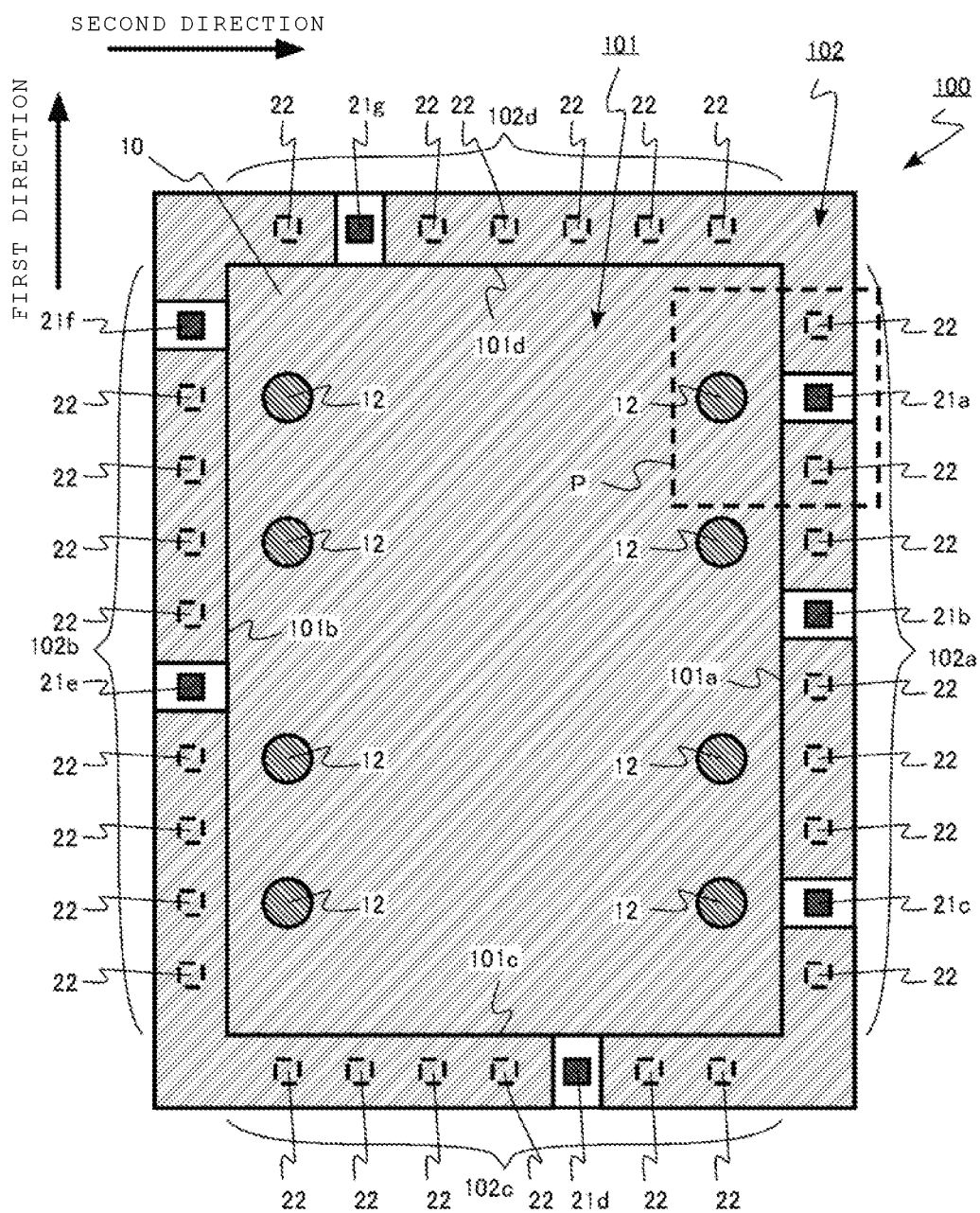
FIG. 1 is a schematic top view of a semiconductor device according to a first embodiment.

Embodiments provide a semiconductor device in which a TSV can be formed stably.

In general, according to one embodiment, a semiconductor device includes a device region covered with a resin film and a dicing region extending along at least one side of the device region, the dicing region including at least a first lithography mark and a second lithography mark. The resin film includes a first dicing region portion which covers a portion of the dicing region between the first lithography mark and the second lithography mark.

Embodiments of the disclosure will be described below with reference to the drawings. In the following description, the same or similar members are denoted by the same reference numerals, and a description of members once described is not again described where appropriate.

In the specification, the term "upper" or "lower" may be used for the sake of convenience. The term "upper" or "lower" indicates a relative positional relation with the drawings, but does not define a positional relation with respect to gravity.

Semiconductor devices according to embodiments will be described below with reference to the drawings.

First Embodiment

A semiconductor device of a first embodiment includes a device region covered with a resin film and a dicing region that surrounds the device region and a first lithographic mark and a second lithographic mark, and the resin film extends between the first lithographic mark and the second lithographic mark.

FIG. 1 is a schematic top view of the semiconductor device of the first embodiment. The semiconductor device of the first embodiment is a semiconductor memory 100. The semiconductor memory 100 includes a device region 101 and a dicing region 102.

The device region 101 is a region where semiconductor devices are formed. For example, memory cell arrays and peripheral circuits are formed in the device region 101. The memory cell arrays and the peripheral circuits include, for example, a transistor and a metal wiring layer.

At least a part of the device region 101 is covered with a protective resin film 10 (resin film). The protective resin film 10 has the function of protecting the semiconductor device formed in the device region 101. The protective resin film 10 is, for example, a polyimide. A surface electrode 12 (electrode) is provided in the device region 101.

The device region 101 is surrounded by a first side 101a and a second side 101b extending in a first direction and facing each other and a third side 101c and a fourth side 101d extending in a second direction orthogonal to the first direction and facing each other.

The dicing region 102 surrounds the device region 101. The dicing region 102 functions as a region in which a wafer is cut by blade dicing or laser dicing and diced into individual pieces or chips, to singulate the plurality of semiconductor memories 100 from the substrate, such as a semiconductor substrate. Various marks, or devices for testing, are provided in the dicing region 102. For example, the marks are lithography marks, and the lithography mark is, for example, an alignment mark or a misalignment measurement mark.

The dicing region 102 includes a lithography mark 21a (a first lithography mark), a lithography mark 21b (a second lithography mark), and lithography marks 21c, 21d, 21e, and 21f. Further, the dicing region 102 includes a plurality of lithography marks 22 (a third lithography mark).

The dicing region 102 includes a first region 102a adjacent to the first side 101a of the device region 101, a second region 102b adjacent to the second side 101b, a third region 102c adjacent to the third side 101c, and a fourth region 102d adjacent to the fourth side 101d.

In the first region 102a of the dicing region 102, the lithography mark 21a and the lithography mark 21b are provided. Between the lithography mark 21a and the lithography mark 21b, the protective resin film 10 is provided. The tops of the lithography mark 21a and the lithography mark 21b are not covered with the protective resin film 10.

The lithography mark 22 is covered with the protective resin film 10. All lithography marks 22 are covered with the protective resin film.

FIG. 2 is an enlarged schematic top view illustrating a portion of the semiconductor device according to the first embodiment. FIG. 2 is an enlarged schematic top view of a region (P in FIG. 1) surrounded by a broken line in FIG. 1.

Figure 3A:
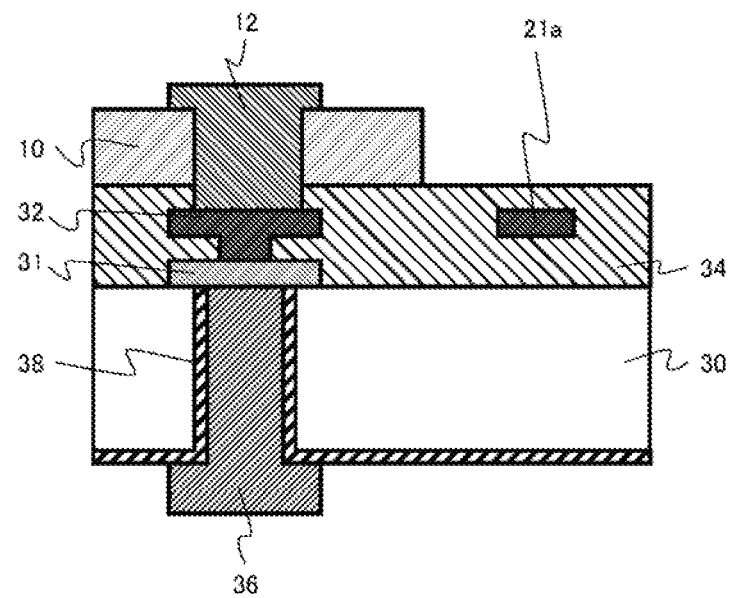
FIGS. 3A and 3B are enlarged schematic section views illustrating a part of the semiconductor device according to the first embodiment.
Figure 3B:
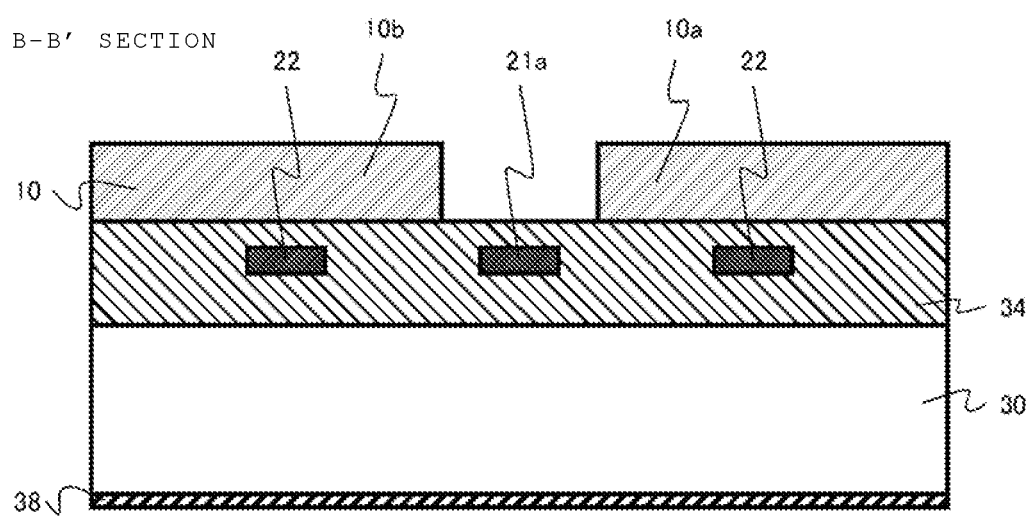

FIGS. 3A and 3B are enlarged schematic section views illustrating a part of the semiconductor device according to the first embodiment. FIG. 3A is a section view taken along line A-A' in FIG. 2, and FIG. 3B is a section view taken along line B-B' in FIG. 2.

The lithography mark 21a and the lithography marks 22 are provided in an interlayer insulating layer 34 provided on a silicon substrate 30. The protective resin film 10 is provided on the interlayer insulating layer 34.

A first conductive layer 31 and a second conductive layer 32 are provided in the interlayer insulating layer 34. The lithography mark 21a and the lithography mark 22 are formed using the material from which the second conductive layer 32 is formed. The lithography mark 21a and the lithography mark 22 may be formed using the material from which the first conductive layer 31 is formed, for example. Further, the lithography mark 21a and the lithography mark 22 may be formed of the material forming other conductive layers or insulating layers (which are not illustrated).

The surface electrode 12 penetrates through the protective resin film 10. The surface electrode 12 is connected to the second conductive layer 32. The second conductive layer 32 is connected to the first conductive layer 31.

A TSV 36 is provided in the silicon substrate 30. An insulating film 38 is provided between the TSV 36 and the silicon substrate 30. The TSV 36 is connected to the first conductive layer 31. The TSV 36 is connected to the surface electrode 12 through the first conductive layer 31 and the second conductive layer 32. For example, the semiconductor memory 100 is electrically connected to another semiconductor memory 100 stacked thereon by the surface electrode 12 and is electrically connected to another semiconductor memory 100 stacked therebelow by the TSV 36.

The lithography mark 21a not covered with the protective resin film 10 is, for example, an alignment mark or a misalignment measurement mark which is used in a lithography process for forming the TSV 36, which process is performed after the protective resin film 10 is formed. The lithography mark 22 covered with the protective resin film 10 is, for example, an alignment mark or a misalignment measurement mark which is used in a lithography process performed before the protective resin film 10 is formed.

The lithography mark 21a is provided between a first portion 10a and a second portion 10b of the protective resin film 10. A distance (d1 in FIG. 2) between the first portion 10a and the second portion 10b is, for example, shorter than a width (Wa in FIG. 2) of a first region 102a of the dicing region 102. The distance (d1 in FIG. 2) between the first portion 10a and the second portion 10b is, for example, 25 μm or more and 50 μm or less. The width (Wa in FIG. 2) of the first region 102a of the dicing region 102 is, for example, 60 μm or more and 80 μm or less.

A coverage ratio of the protective resin film 10 in the dicing region 102 is, for example, 50% or more.

Figure 4:
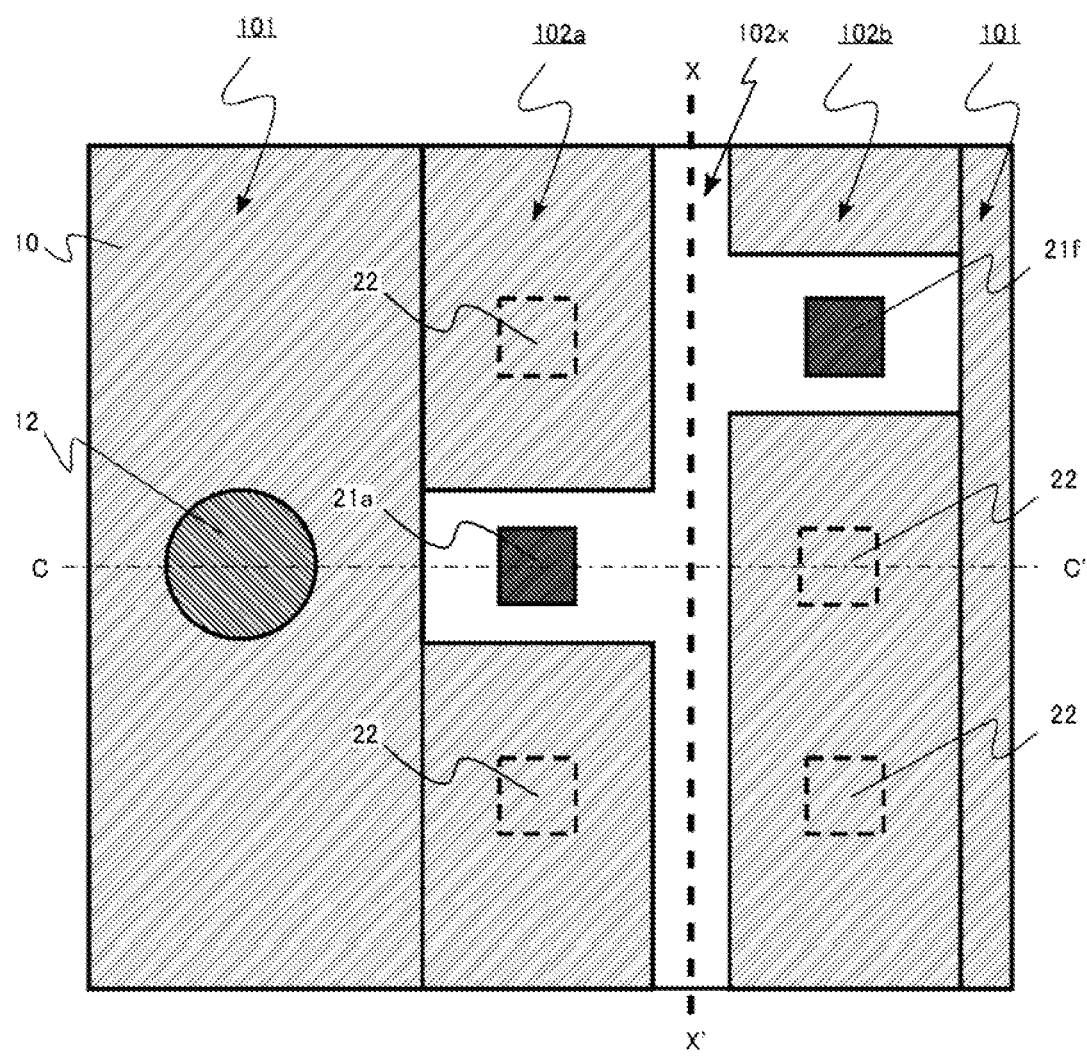
FIG. 4 is an enlarged schematic top view illustrating a part of the semiconductor device according to the first embodiment.
Figure 5:
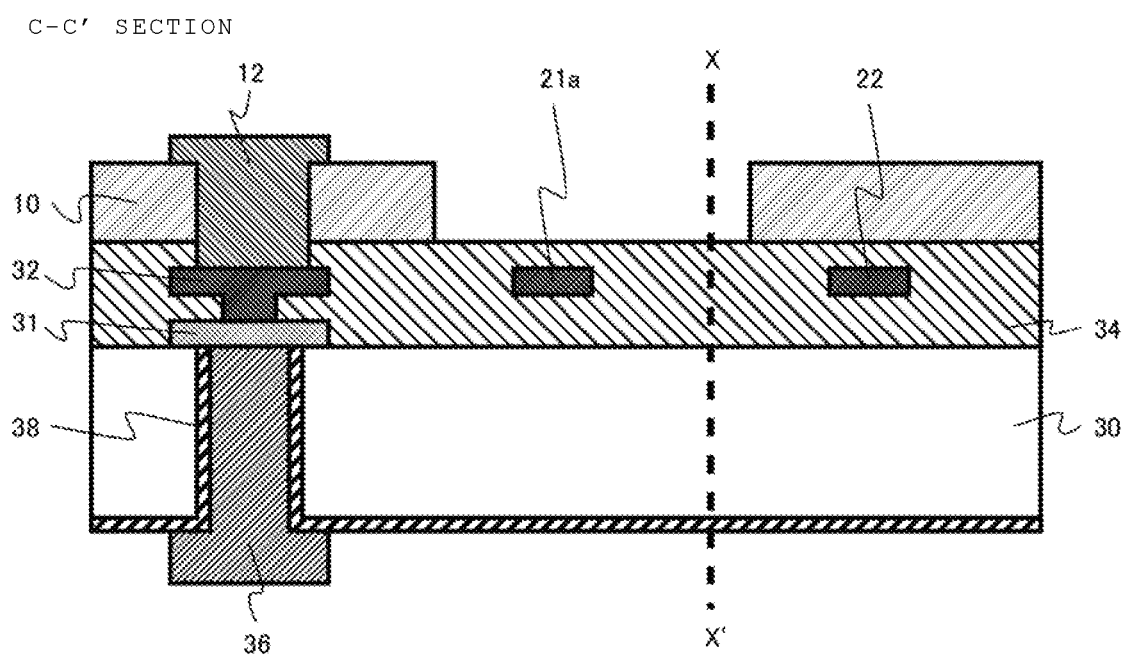
FIG. 5 is an enlarged schematic section view illustrating a part of the semiconductor device according to the first embodiment.
Figure 6:
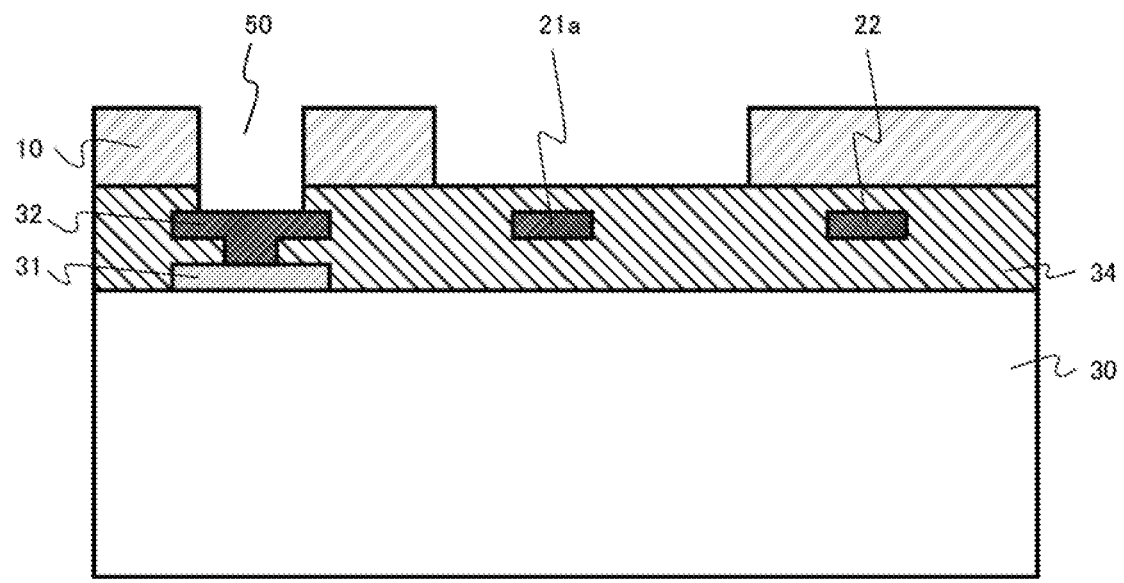
FIG. 6 is a schematic section view illustrating a method of forming a TSV of the semiconductor device according to the first embodiment.

FIG. 4 is an enlarged schematic top view illustrating a part of the semiconductor device according to the first embodiment. FIG. 4 illustrates a dicing region in a wafer state before the semiconductor memory 100 is diced into individual pieces by dicing. FIG. 5 is an enlarged schematic section view illustrating a part of the semiconductor device according to the first embodiment. FIG. 5 is a section view taken along line C-C' in FIG. 4.

In the drawing, line X-X' indicates a prescribed cutting line at the time of dicing. From the viewpoint of preventing deterioration of a dicing yield of functioning chips due to chipping or the like and peeling of the protective resin film 10, a cutting region 102x not covered with the protective resin film 10 is required having a predetermined width along the prescribed cutting line. The cutting region 102x has a width of 20 μm or more and 40 μm or less, for example.

In the wafer state, the second region 102b of the adjacent semiconductor memory 100 is adjacent to the first region 102a of the dicing region 102. The cutting region 102x is provided between the first region 102a and the second region 102b of the adjacent semiconductor memory 100. In the second region 102b of the adjacent semiconductor memory 100, the lithography mark 21f not covered with the protective resin film 10 is present.

A method of forming the TSV of the semiconductor device according to the first embodiment will be described below. FIGS. 6 to 14 are schematic section views illustrating the method of forming the TSV of the semiconductor device according to the first embodiment. FIGS. 6 to 14 are section views at positions corresponding to the section taken along line C-C' in FIG. 4.

First, a plurality of semiconductor memories is formed. On the wafer, the interlayer insulating layer 34 is formed on the silicon substrate 30. The first conductive layer 31 and the second conductive layer 32 are provided in the interlayer insulating layer 34. The lithography mark 21a and the lithography mark 22 are formed using the material from which the second conductive layer 32 is formed. The protective resin film 10 is formed on the interlayer insulating layer 34.

Next, the protective resin film 10 in a region 50, where the surface electrode 12 is to be formed, is removed. In the region 50 where the surface electrode 12 is to be formed, the interlayer insulating layer 34 is removed and the second conductive layer 32 is exposed. In addition, the protective resin film 10 over the lithography mark 21a is removed (see FIG. 6).

Figure 7:
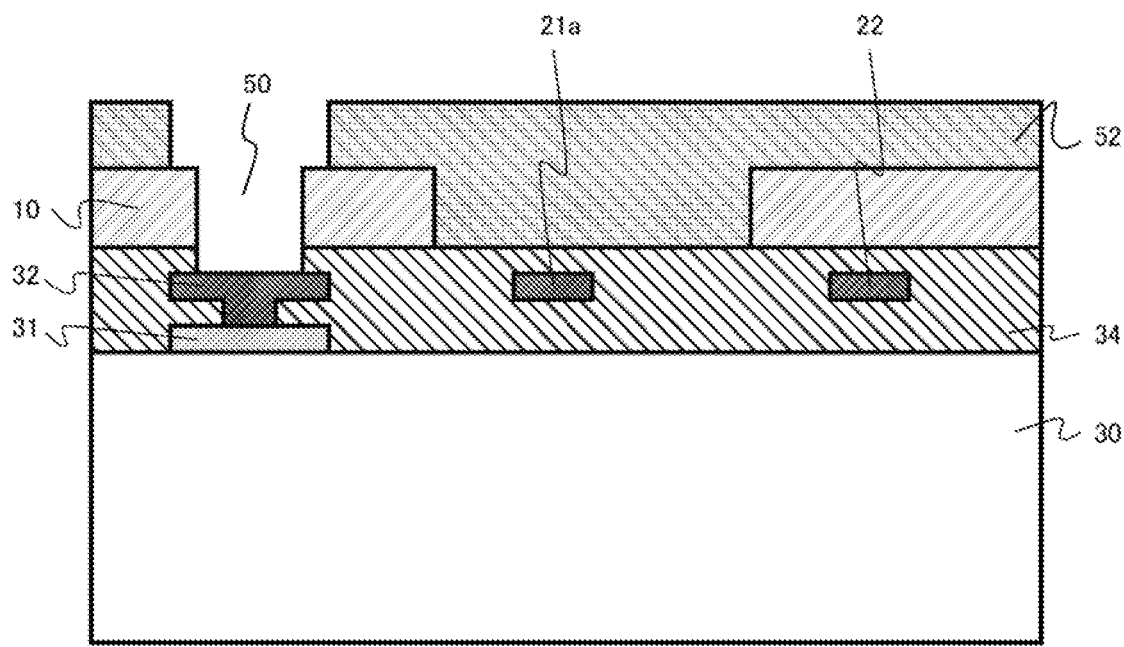
FIG. 7 is a schematic section view illustrating a method of forming the TSV of the semiconductor device according to the first embodiment.
Figure 8:
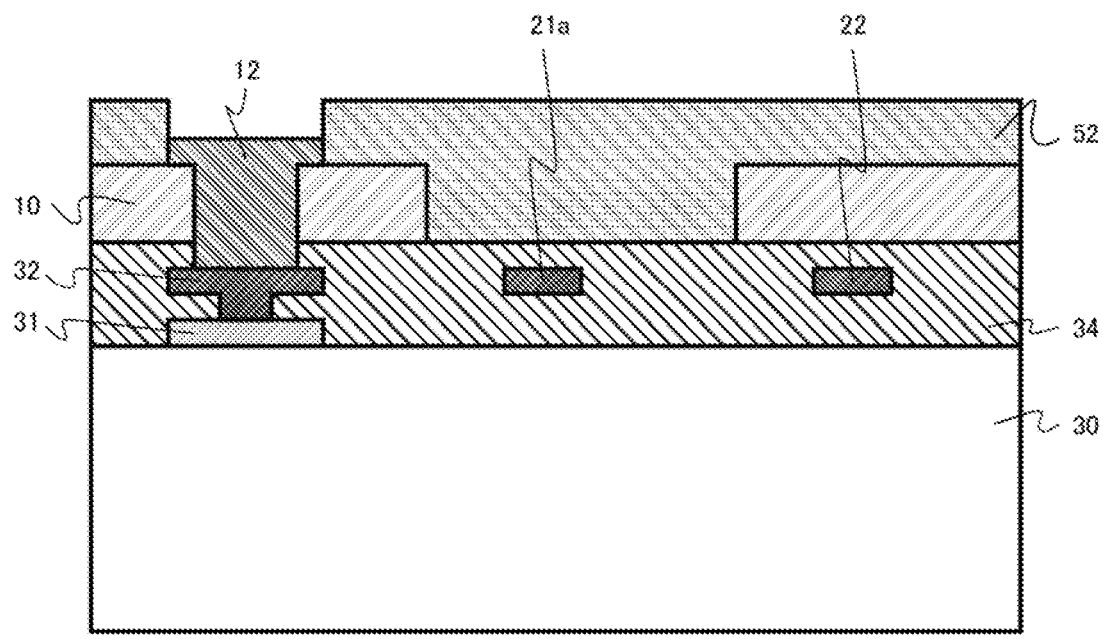
FIG. 8 is a schematic section view illustrating a method of forming the TSV of the semiconductor device according to the first embodiment.
Figure 9:
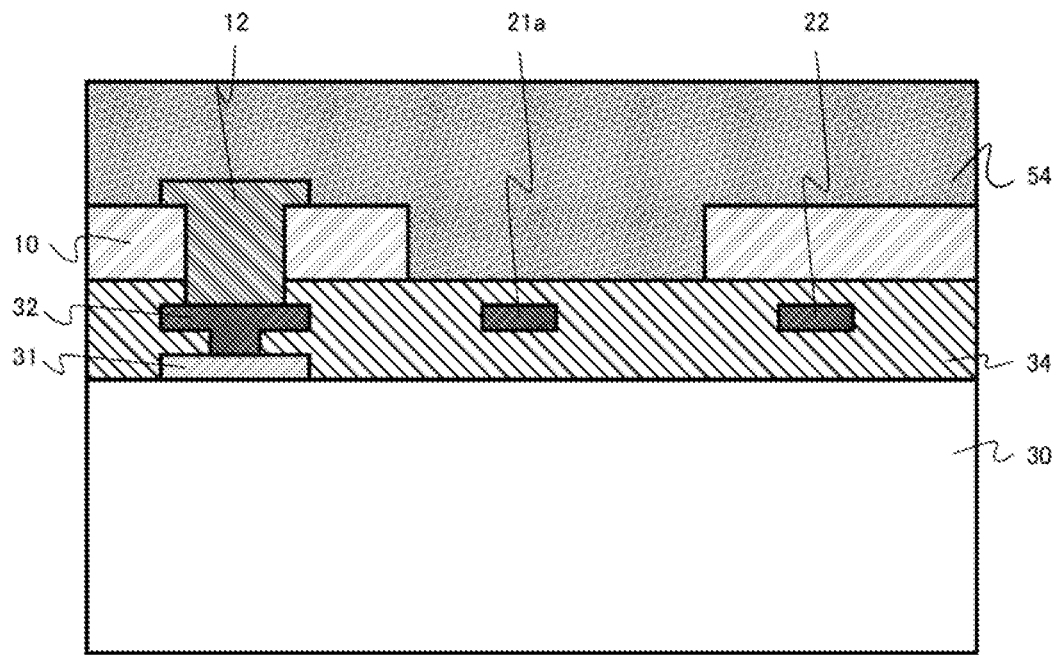
FIG. 9 is a schematic section view illustrating a method of forming the TSV of the semiconductor device according to the first embodiment.

Next, a resist pattern 52 is formed on the protective resin film 10, and an opening is provided therein in the region 50 where the surface electrode 12 is to be formed (see FIG. 7). Next, the surface electrode 12 is formed in the opening of the resist pattern 52 by a plating method (see FIG. 8).

Subsequently, the resist pattern 52 is removed. After the resist pattern 52 is removed, an adhesive layer 54 is formed on the protective resin film 10 (see FIG. 9). The adhesive layer 54 is formed by applying an adhesive onto the wafer, for example. The adhesive layer 54 is formed of a resin.

Figure 10:
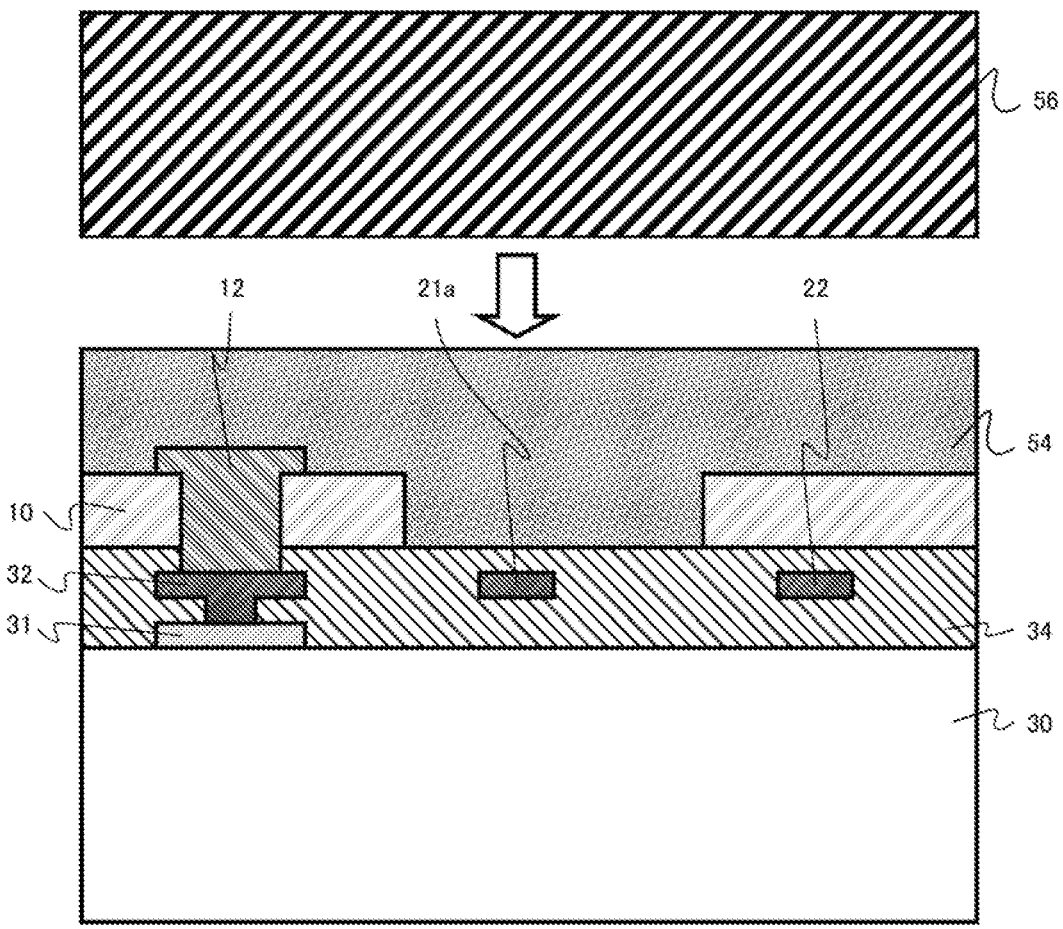
FIG. 10 is a schematic section view illustrating a method of forming the TSV of the semiconductor device according to the first embodiment.
Figure 11:
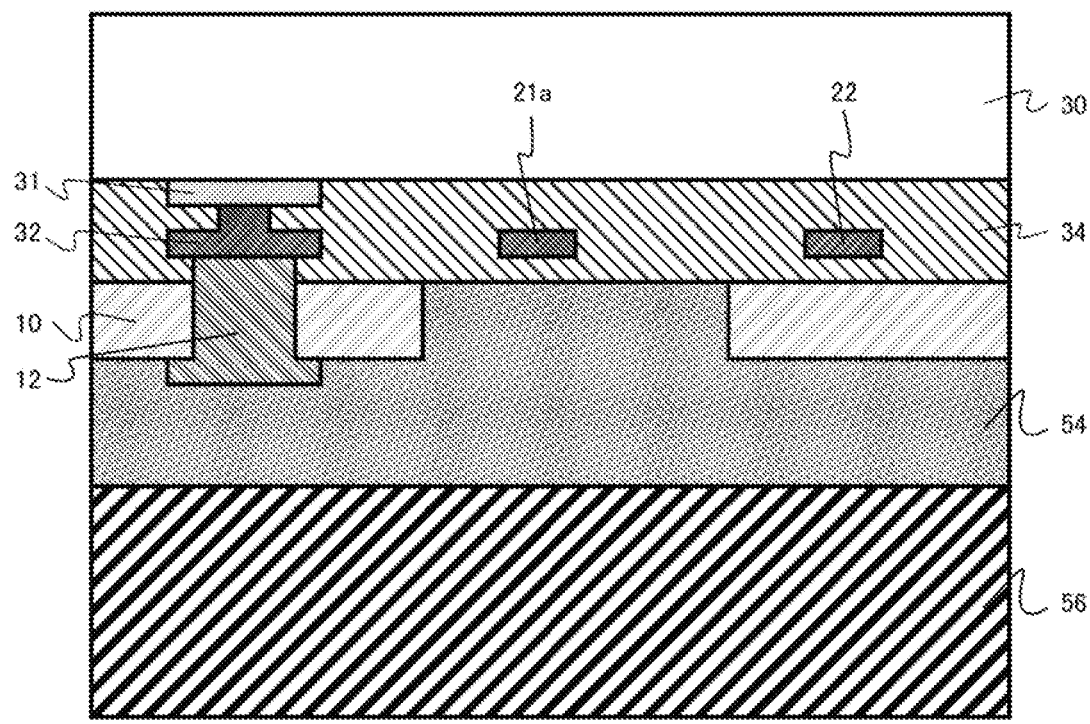
FIG. 11 is a schematic section view illustrating a method of forming the TSV of the semiconductor device according to the first embodiment.

Next, a support substrate 56 is attached to the adhesive layer 54 (see FIG. 10). The wafer and the support substrate 56 are bonded to each other with the adhesive layer 54. Subsequently, the wafer bonded to the support substrate 56 is vertically inverted. Then, the silicon substrate 30 is thinned by polishing (see FIG. 11).

Figure 12:
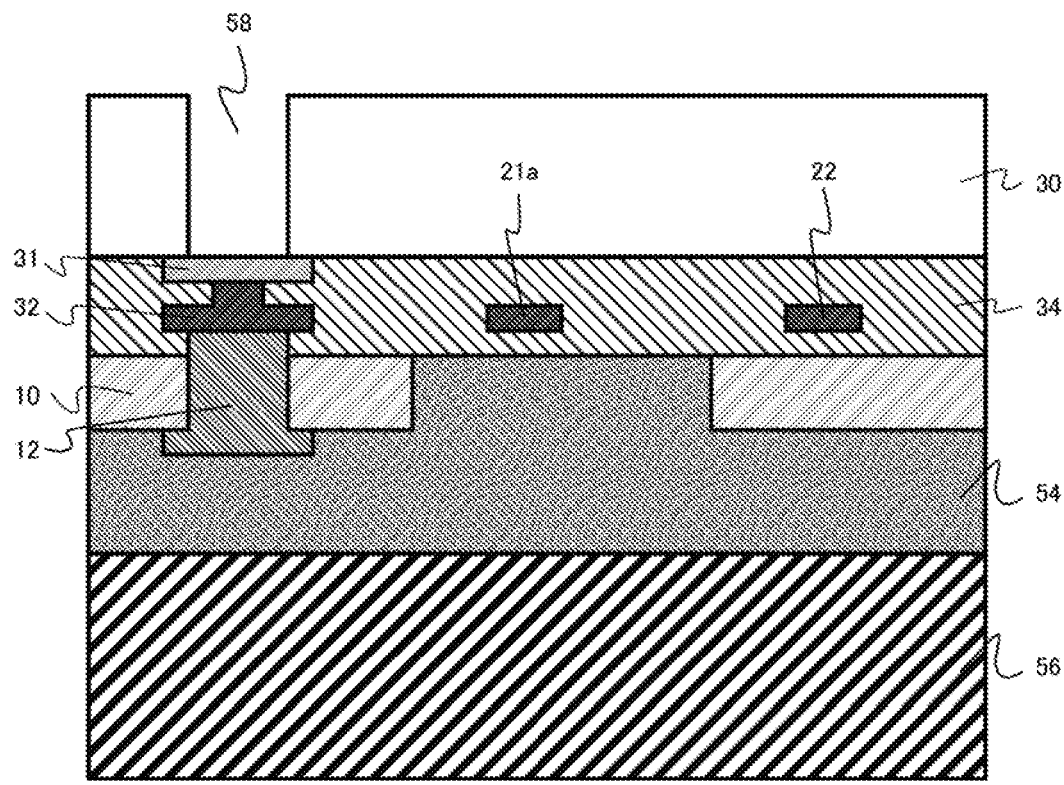
FIG. 12 is a schematic section view illustrating a method of forming the TSV of the semiconductor device according to the first embodiment.
Figure 13:
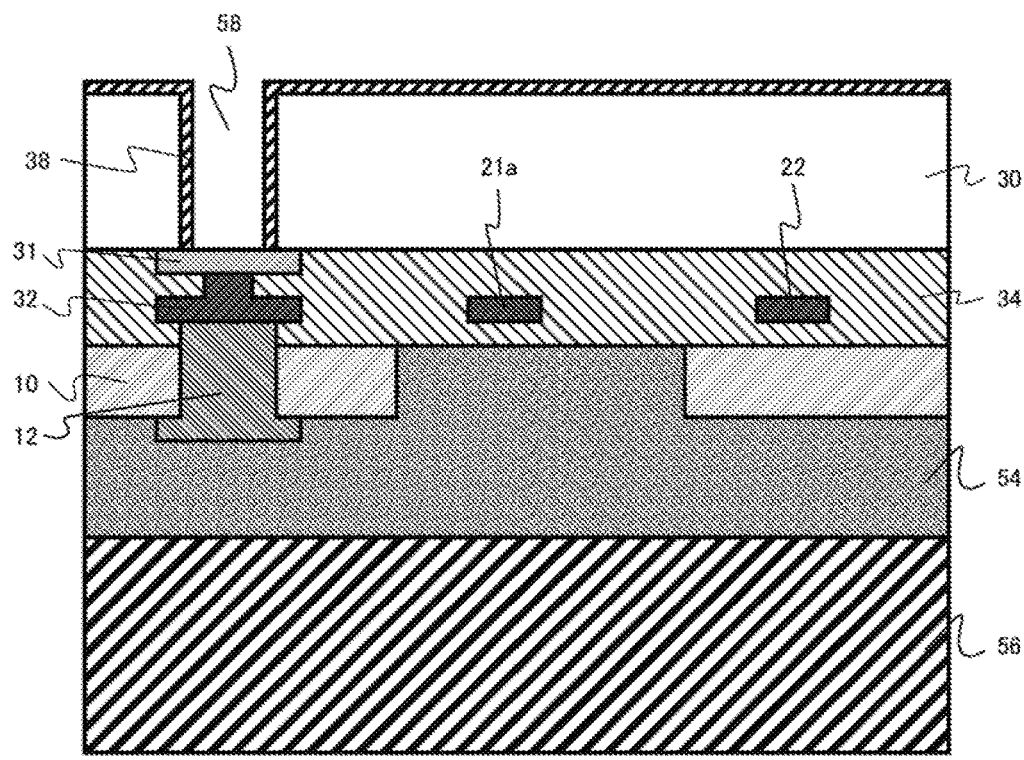
FIG. 13 is a schematic section view illustrating a method of forming the TSV of the semiconductor device according to the first embodiment.
Figure 14:
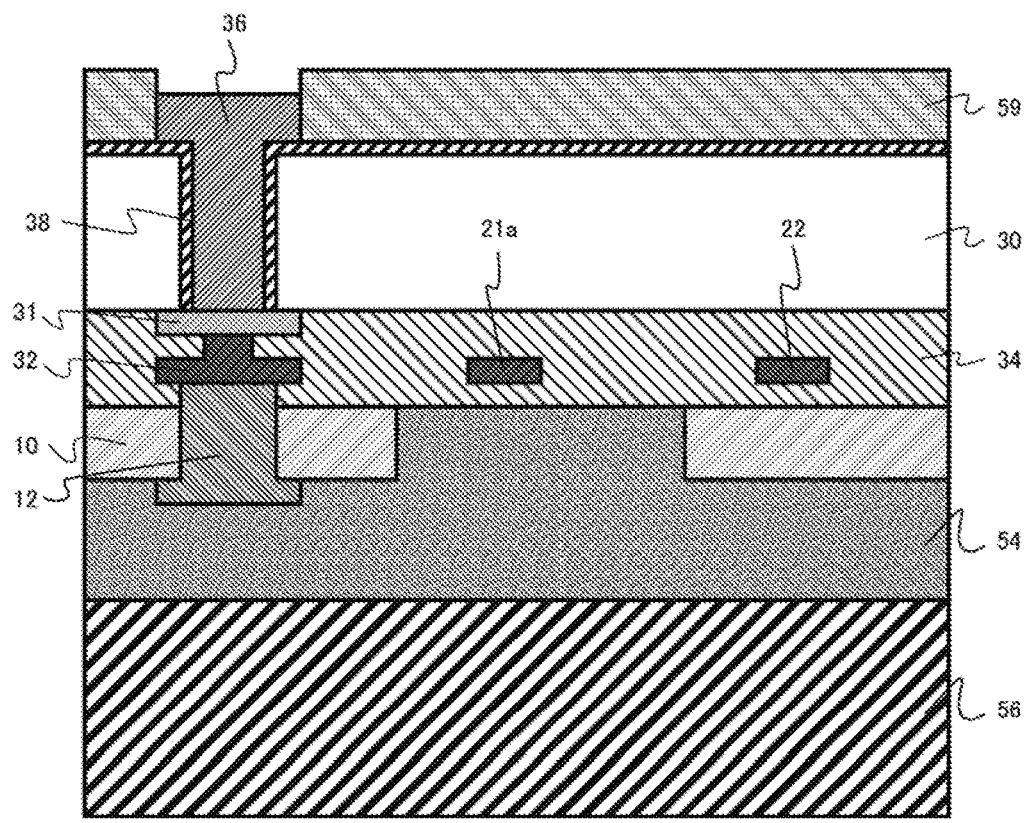
FIG. 14 is a schematic section view illustrating a method of forming the TSV of the semiconductor device according to the first embodiment.

Next, an opening 58 is provided in the silicon substrate 30 by dry etching, for example (see FIG. 12). Next, the insulating film 38 is formed so as to cover a side surface of the opening 58 (see FIG. 13). The insulating film 38 is deposited by chemical vapor deposition (CVD), for example. Next, a resist pattern 59 is formed on the insulating film 38. Subsequently, the TSV 36 is formed in an opening of the resist pattern 59 by a plating method, for example (see FIG. 14).

Figure 15:
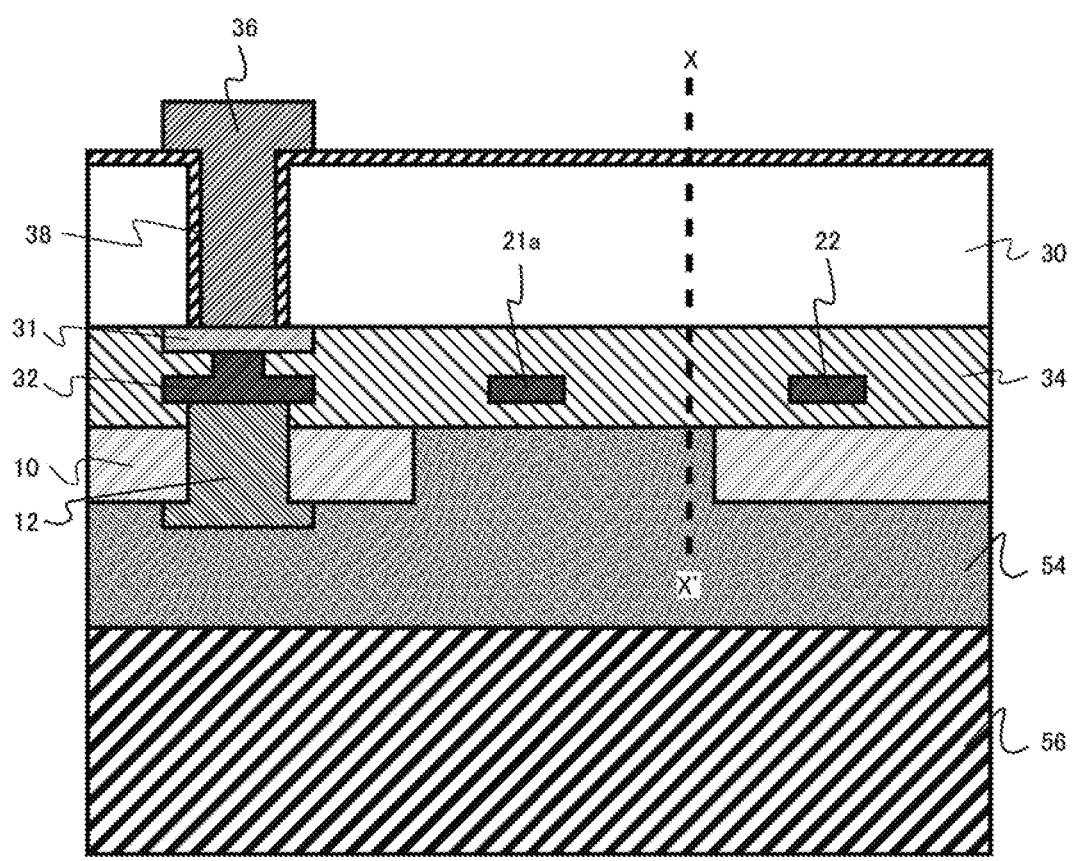
FIG. 15 is a schematic section view illustrating a method of forming the TSV of the semiconductor device according to the first embodiment.

Next, the wafer is cut along the prescribed cutting line X-X' by blade dicing, for example, and the semiconductor memory is diced into individual pieces (see FIG. 15). Thereafter, the support substrate 56 is separated from the semiconductor memory.

Through the above method, the TSV 36 is formed in the semiconductor memory 100.

Operations and effects of the semiconductor device according to the first embodiment will be described below.

Figure 16:
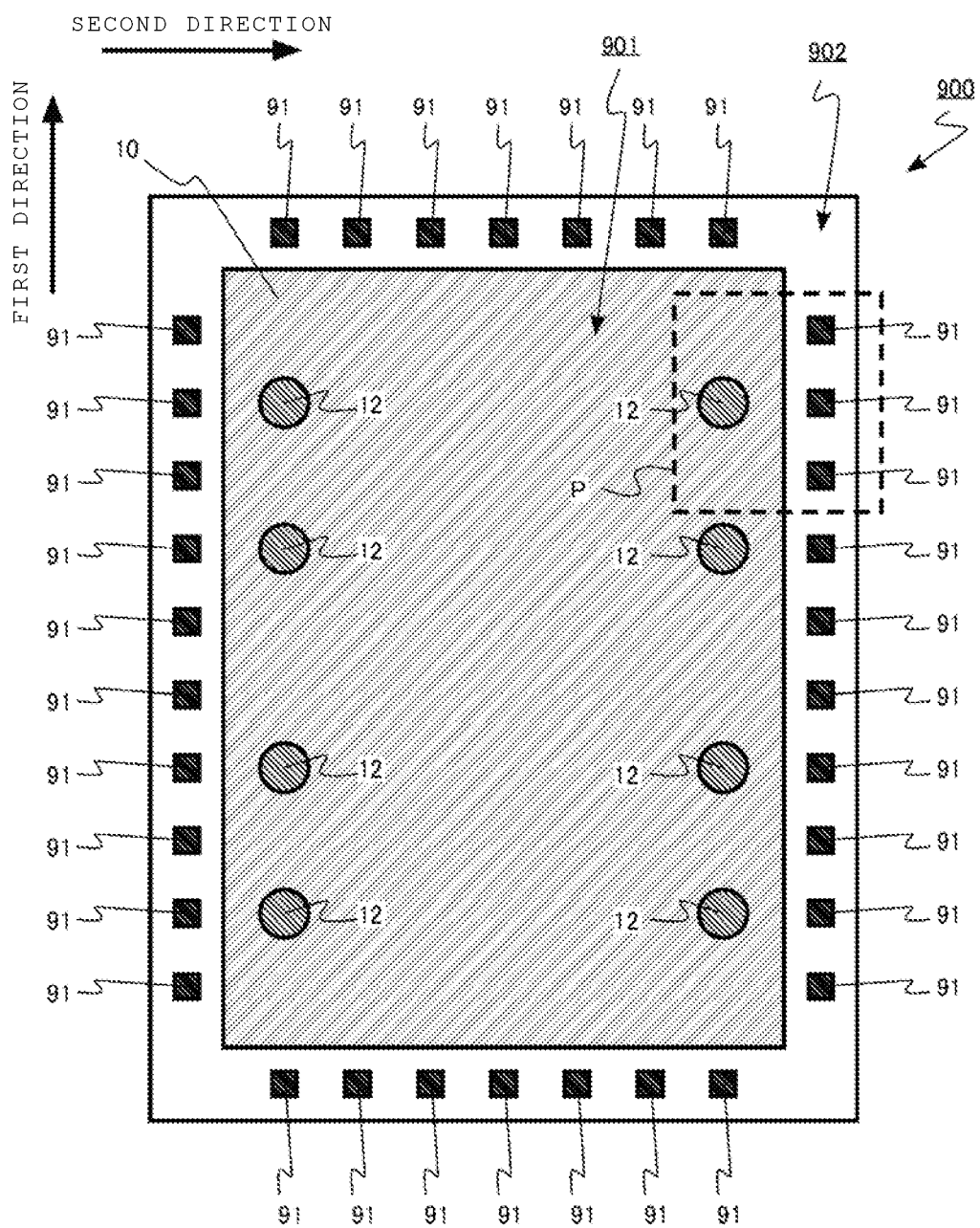
FIG. 16 is a schematic top view of a semiconductor device according to a comparative example.

FIG. 16 is a top view of a semiconductor device according to a comparative example. The semiconductor device of the comparative example is a semiconductor memory 900. The semiconductor memory 900 includes a device region 901 and a dicing region 902.

Figure 17:
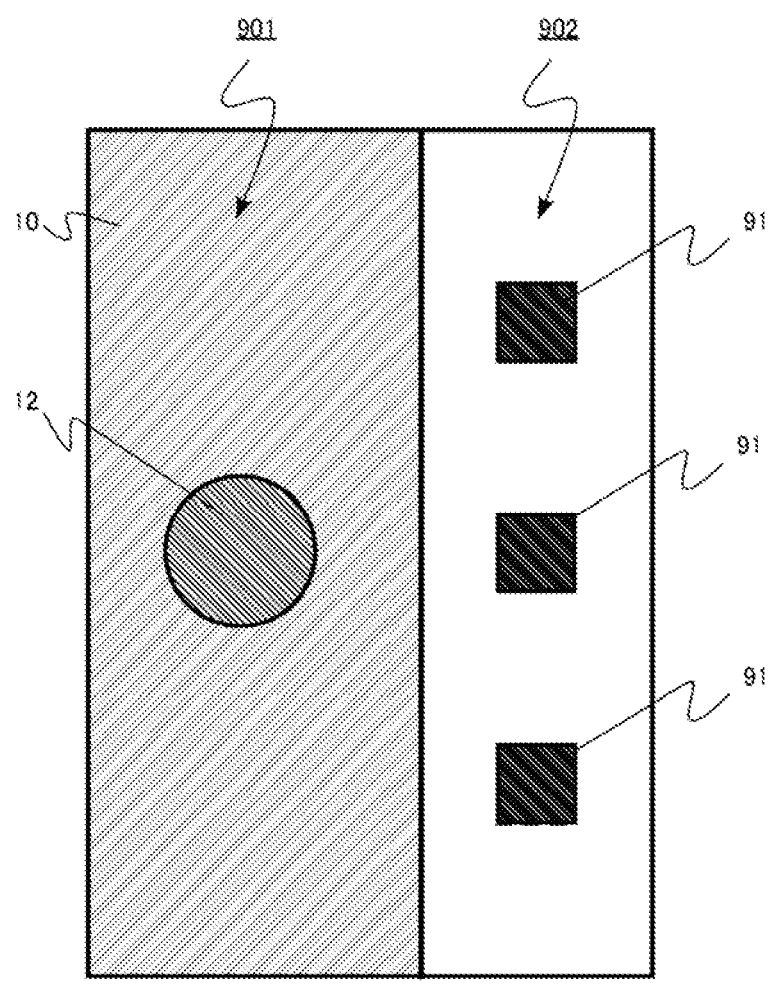
FIG. 17 is an enlarged schematic top view illustrating a part of the semiconductor device according to the comparative example.

FIG. 17 is an enlarged schematic top view illustrating apart of the semiconductor device according to the comparative example. FIG. 17 is an enlarged schematic top view of a region (P in FIG. 16) surrounded by a broken line in FIG. 16. FIG. 17 is a view corresponding to FIG. 2 of the first embodiment.

Figure 18:
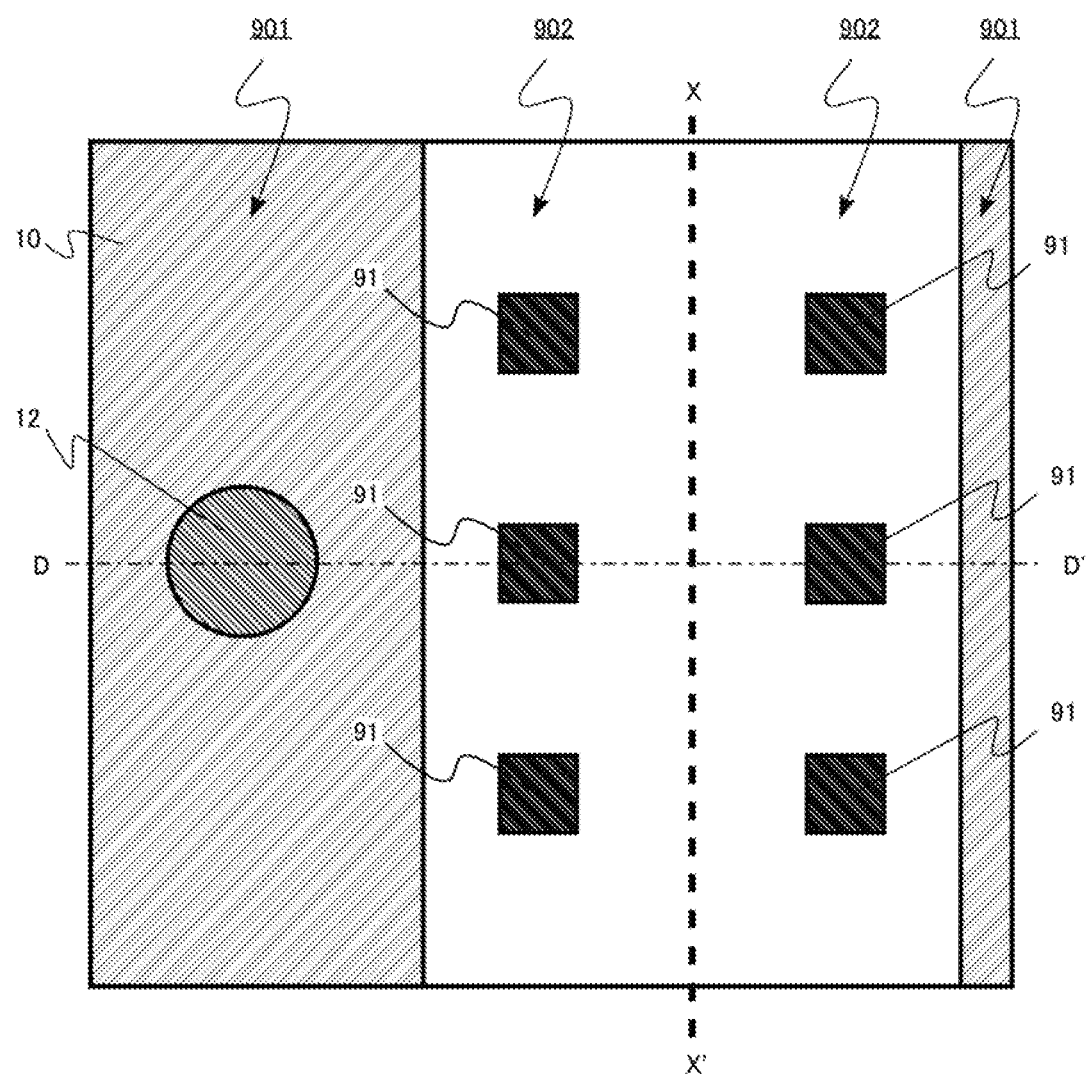
FIG. 18 is an enlarged schematic top view illustrating apart of the semiconductor device according to the comparative example.
Figure 19:
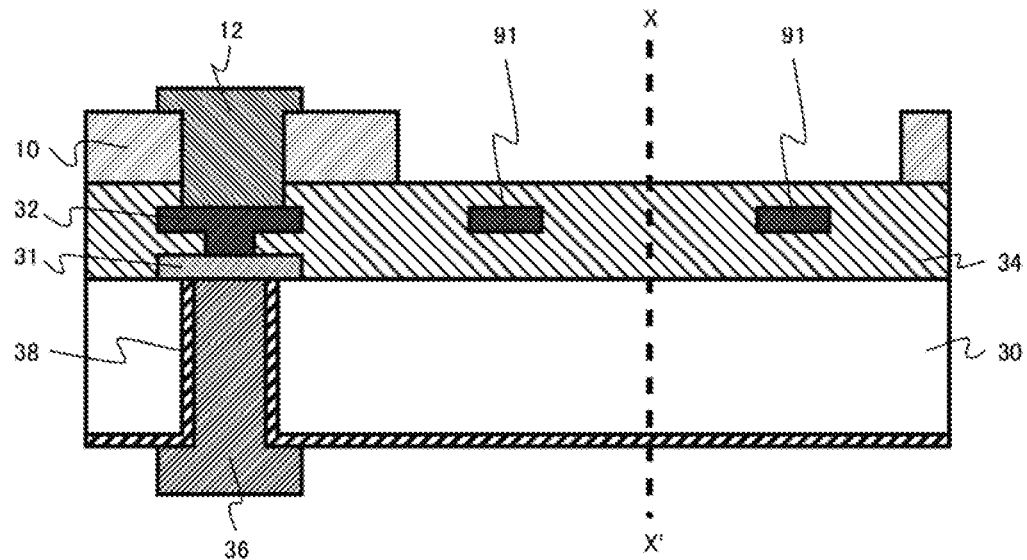
FIG. 19 is an enlarged schematic section view illustrating a part of the semiconductor device according to the comparative example.

FIG. 18 is an enlarged schematic top view illustrating apart of the semiconductor device according to the comparative example. FIG. 18 illustrates a dicing region in a wafer state before the semiconductor memory 900 is diced into individual pieces by dicing. FIG. 18 is a view corresponding to FIG. 4 of the first embodiment. FIG. 19 is an enlarged schematic section view illustrating a part of the semiconductor device according to the comparative example. FIG. 19 is a section view taken along line D-D' in FIG. 18.

The dicing region 902 includes a plurality of lithographic marks 91. The plurality of lithography marks 91 which are not covered with a protective resin film 10.

As illustrated in FIGS. 16 and 17, the semiconductor memory 900 of the comparative example differs from the semiconductor memory 100 of the first embodiment in that the protective resin film 10 is not provided in the dicing region 902. The semiconductor memory 900 differs from the semiconductor memory 100 of the first embodiment in that all the lithography marks provided in the dicing region 902 are not covered with the protective resin film 10.

In the semiconductor memory 900 of the comparative example, as illustrated in FIGS. 18 and 19, since the protective resin film 10 is not provided in the dicing region 902, there is a wide region where the protective resin film 10 does not exist on either side of the prescribed cutting line X-X'. In the dicing region 902, a step is formed due to a pattern of the protective resin film 10.

Figure 20:
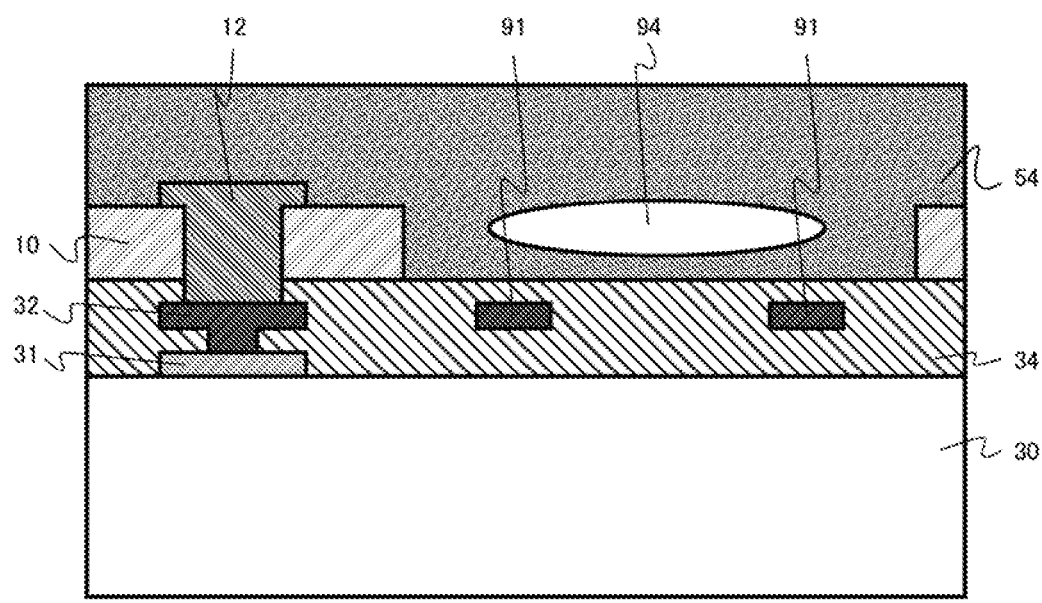
FIG. 20 is a schematic section view illustrating a method of forming a TSV of the semiconductor device according to the comparative example.

FIG. 20 is a schematic section view illustrating a method of forming a TSV of the semiconductor device according to the comparative example. FIG. 20 is a section view at a position corresponding to the section taken along line D-D' in FIG. 18.

FIG. 20 is a section view immediately after an adhesive layer 54 is formed on the protective resin film 10. As illustrated in FIG. 20, a cavity 94 may be formed inside the adhesive layer 54 on dicing region 902 in some cases.

When the cavity 94 is present inside the adhesive layer 54, a gas expands in the cavity 94 during the subsequent heat treatment, and thus the semiconductor memory 900 may be physically destroyed. The heat treatment is, for example, a heat treatment that is performed during or after when an insulating film 38 on the side surface of the TSV 36 is deposited by CVD. Particularly, as the size of the cavity 94 increases, destruction easily occurs, which is a problem.

In the semiconductor memory 100 of the first embodiment, the protective resin film 10 is provided in the dicing region 102, and thus the area of the region where the protective resin film 10 does not exist on the semiconductor memory 100 is reduced. In addition, the size of the region where the protective resin film 10 does not exist is also reduced. Accordingly, the cavity 94 is prevented from being formed inside the adhesive layer 54. Further, even if a cavity is formed, the formation of the large-sized cavity 94 is prevented. Therefore, it is possible to prevent the destruction of the semiconductor memory 100 at the time of forming the TSV 36 and to stably form the TSV 36.

In the semiconductor memory 100 of the first embodiment, the alignment mark or the misalignment measurement mark used in the lithography process at the time of forming the TSV 36 is not covered with the protective resin film 10. Accordingly, the lithography process at the time of forming TSV 36 can be executed without difficulty during alignment.

In the semiconductor memory 100 of the first embodiment, the distance (d1 in FIG. 2) between the first portion 10a and the second portion 10b of the protective resin film 10 is preferably shorter than the width (Wa in FIG. 2) of the first region 102a of the dicing region 102. When the distance (d1 in FIG. 2) between the first portion 10a and the second portion 10b is shortened, the cavity 94 is prevented from being formed inside the adhesive layer 54.

In the semiconductor memory 100 of the first embodiment, the coverage ratio of, i.e., the percentage of the relevant area covered by, the protective resin film 10 in the dicing region 102 is preferably 50% or more, more preferably 60% or more, and furthermore preferably 70% or more. As the coverage ratio of the protective resin film 10 increases, the cavity 94 is prevented from being formed inside the adhesive layer 54.

As described above, according to the semiconductor memory 100 of the first embodiment, the protective resin film 10 is provided in a part of the dicing region 102, and thus the TSV 36 can be stably formed.

Second Embodiment

A semiconductor device of a second embodiment differs from that of the first embodiment in that a width in a second direction of a second region is narrower than a width in the second direction of a first region and a width in a first direction of a fourth region is narrower than a width in the first direction of a third region. Hereinafter, some content overlapping with that of the first embodiment will not be described.

Figure 21:
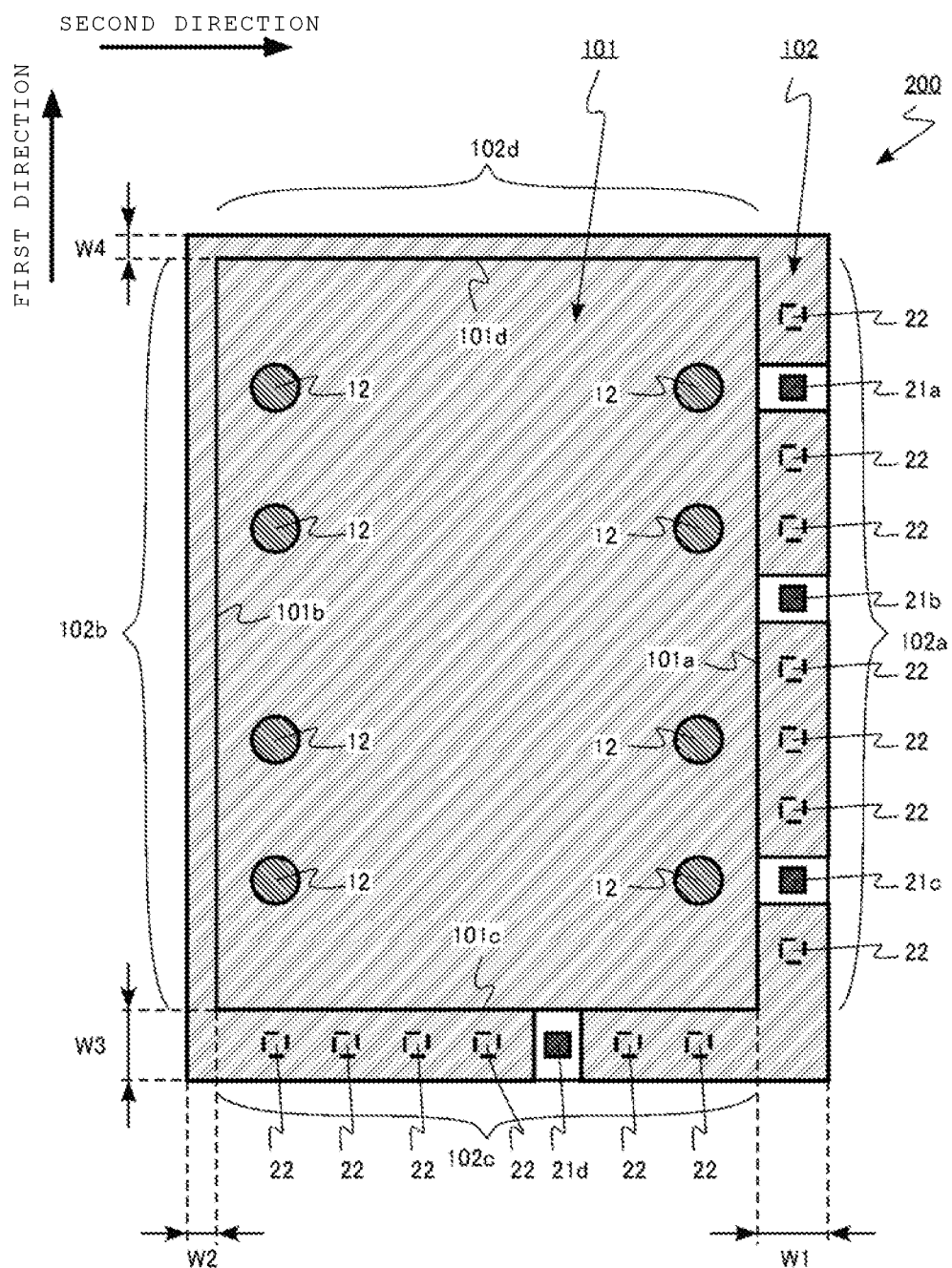
FIG. 21 is a schematic top view of a semiconductor device according to a second embodiment.

FIG. 21 is a schematic top view of the semiconductor device of the second embodiment. The semiconductor device of the second embodiment is a semiconductor memory 200. The semiconductor memory 200 of the second embodiment includes a device region 101 and a dicing region 102.

Figure 22:
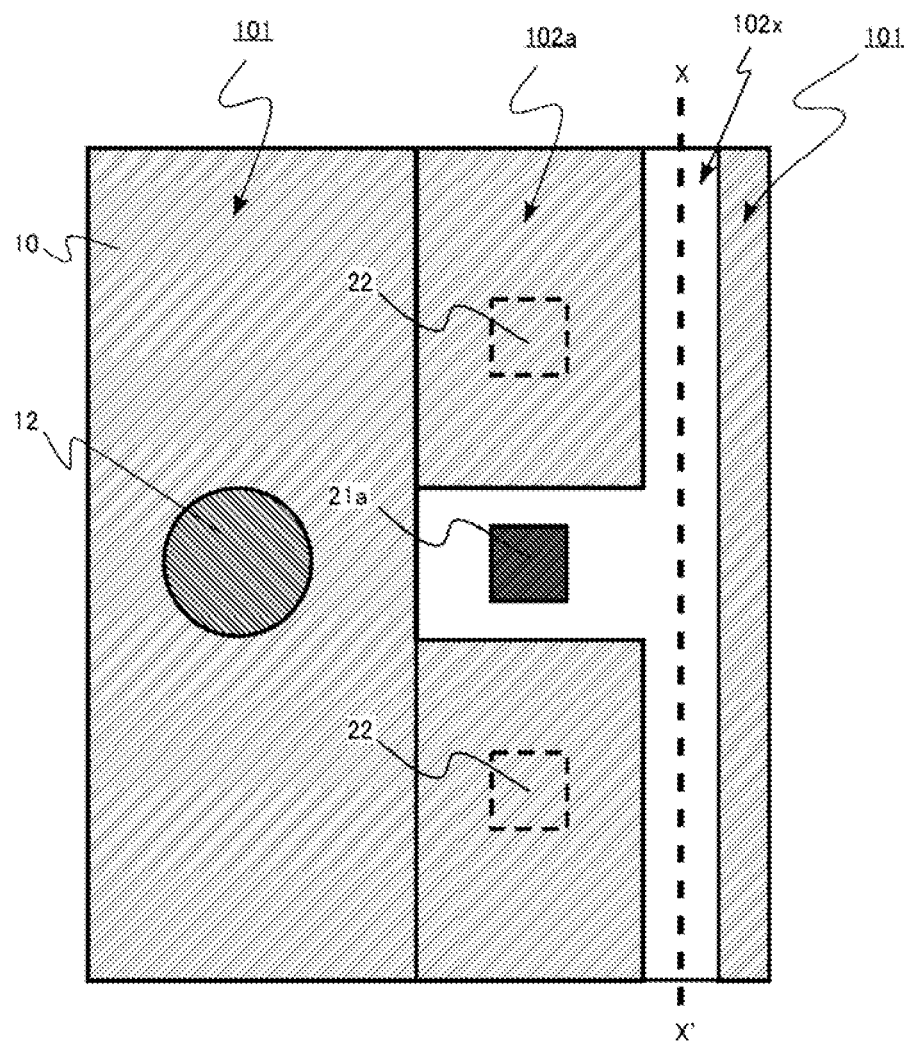
FIG. 22 is an enlarged schematic top view illustrating a part of the semiconductor device according to the second embodiment.

FIG. 22 is an enlarged schematic top view illustrating a part of the semiconductor device according to the second embodiment. FIG. 22 illustrates a dicing region in a wafer state before the semiconductor memory 200 is diced into individual pieces by dicing. FIG. 22 is a view corresponding to FIG. 4 of the first embodiment.

The device region 101 is surrounded by a first side 101a and a second side 101b extending in a first direction and facing each other and a third side 101c and a fourth side 101d extending in a second direction orthogonal to the first direction and facing each other.

The dicing region 102 includes a lithography mark 21a (a first lithography mark), a lithography mark 21b (a second lithography mark), and lithography marks 21c and 21d. Further, the dicing region 102 includes a plurality of lithography marks 22 (a third lithography mark).

The dicing region 102 includes a first region 102a adjacent to the first side 101a of the device region 101, a second region 102b adjacent to the second side 101b, a third region 102c adjacent to the third side 101c, and a fourth region 102d adjacent to the fourth side 101d.

A width (W2 in FIG. 21) in the second direction of the second region 102b is narrower than a width (W1 in FIG. 21) in the second direction of the first region 102a, and a width (W4 in FIG. 21) in the first direction of the fourth region 102d is narrower than a width (W3 in FIG. 21) in the first direction of the third region 102c.

In the semiconductor memory 200 of the second embodiment, no lithography mark is provided in the second region 102b and the fourth region 102d. Therefore, it is possible to narrow the width (W2 in FIG. 21) in the second direction of the second region 102b and the width (W4 in FIG. 21) in the first direction of the fourth region 102d.

As described with reference to FIG. 4 in the first embodiment, from the viewpoint of preventing deterioration of a dicing yield due to chipping or the like, a cutting region 102x not covered with the protective resin film 10 is required to have a predetermined width in the vicinity of the prescribed cutting line. The cutting region 102x has a width of 30 µm or more and 45 µm or less, for example. When the dicing region 102 is covered with the protective resin film 10, the cutting region 102x has an area penalty, and as a result, the chip size after the semiconductor memory 100 of the first embodiment is diced into individual pieces may become larger compared to the semiconductor memory 900 of the comparative example.

In the semiconductor memory 200 of the second embodiment, the width (W2 in FIG. 21) in the second direction of the second region 102b is narrower than the width (W1 in FIG. 21) in the second direction of the first region 102a, and the width (W4 in FIG. 21) in the first direction of the fourth region 102d is narrower than the width (W3 in FIG. 21) in the first direction of the third region 102c. Therefore, even when the cutting region 102x is provided, it is possible to reduce the chip size after the semiconductor memory 200 is diced into individual pieces.

Similarly to the semiconductor memory of the first embodiment, when the lithography mark is also provided in the second region 102b and the fourth region 102d, as illustrated in FIG. 2, there can be a region, i.e., the regions over the lithography marks 21 adjacent to each other across the cutting region 2x, where the protective resin film 10 does not exist on both sides across the cutting region 102x before the adhesive layer 54 is applied. Such a portion becomes an irregular portion as a pattern of the protective resin film 10, and the cavity 94 easily occurs in the adhesive layer 54. In addition, it is hard to predict the presence or absence of occurrence of the cavity 94 in the adhesive layer 54.

In the semiconductor memory 200 of the second embodiment, since no lithographic mark is provided in the second region 102b and the fourth region 102d, there is a region where the protective resin film 10 does not exist on only one side of the cutting region 102x before the adhesive layer 54 is applied. Therefore, the occurrence of the cavity 94 in the adhesive layer 54 is prevented. Further, since the pattern of the protective resin film 10 is simplified, it is easy to predict the presence or absence of the occurrence of the cavity 94 in the adhesive layer 54, and the layout of the protective resin film 10 can be designed with high robustness.

As described above, according to the semiconductor memory 200 of the second embodiment, the protective resin film 10 is provided in a part of the dicing region 102, and thus the TSV 36 can be stably formed. Further, it is possible to reduce the chip size of the semiconductor memory 200. In addition, it is possible to design the layout of the protective resin film 10 with high robustness.

Third Embodiment

A semiconductor device of a third embodiment differs from that of the first embodiment in that a first lithography mark is provided between a first portion and a second portion of a resin film and a metal layer is provided between the first portion and the second portion. Hereinafter, some contents overlapping with the first embodiment will not be described.

Figure 23:
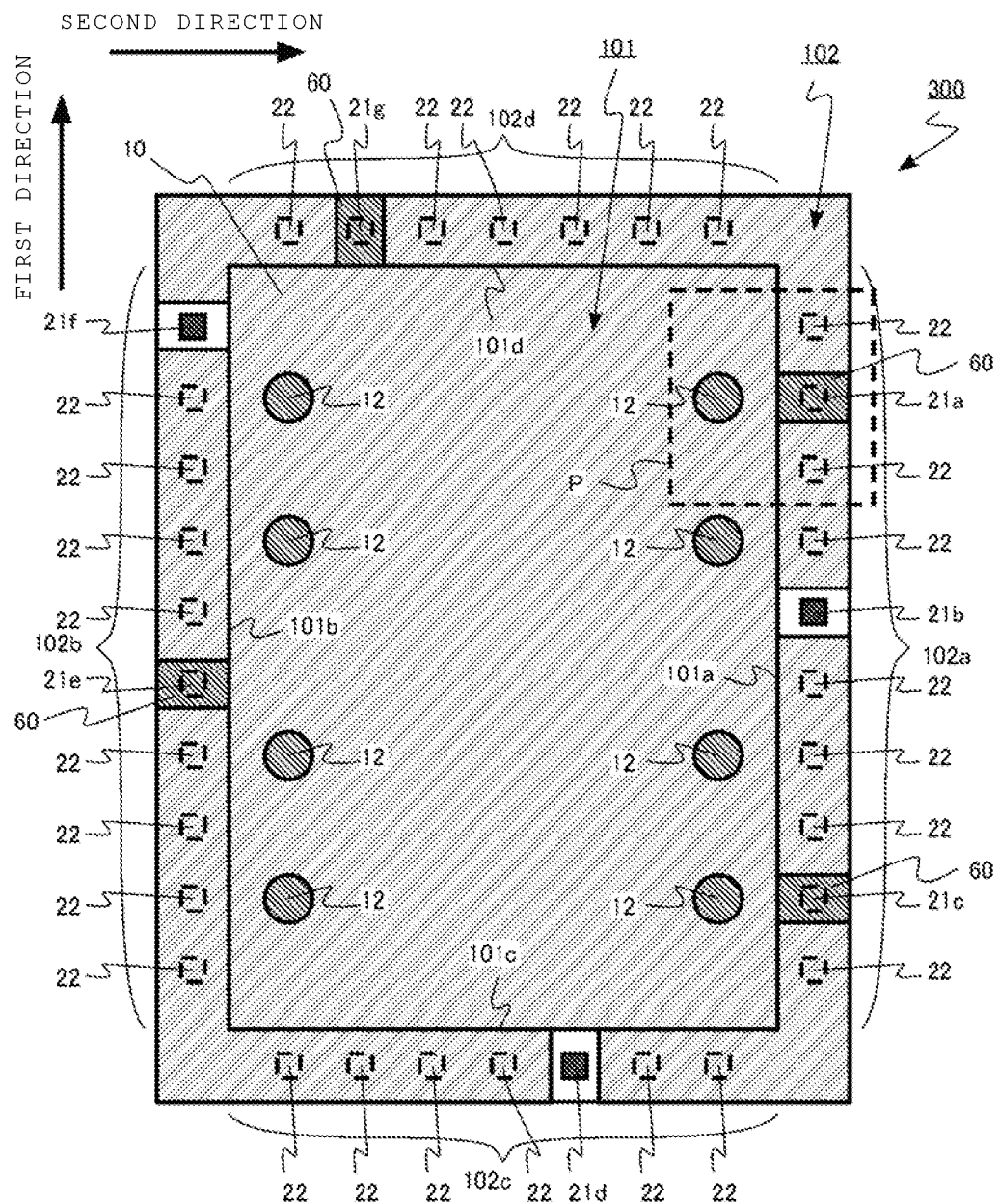
FIG. 23 is a schematic top view of a semiconductor device according to a third embodiment.

FIG. 23 is a schematic top view of the semiconductor device of the third embodiment. The semiconductor device of the third embodiment is a semiconductor memory 300. The semiconductor memory 300 of the third embodiment includes a device region 101 and a dicing region 102.

Figure 24:
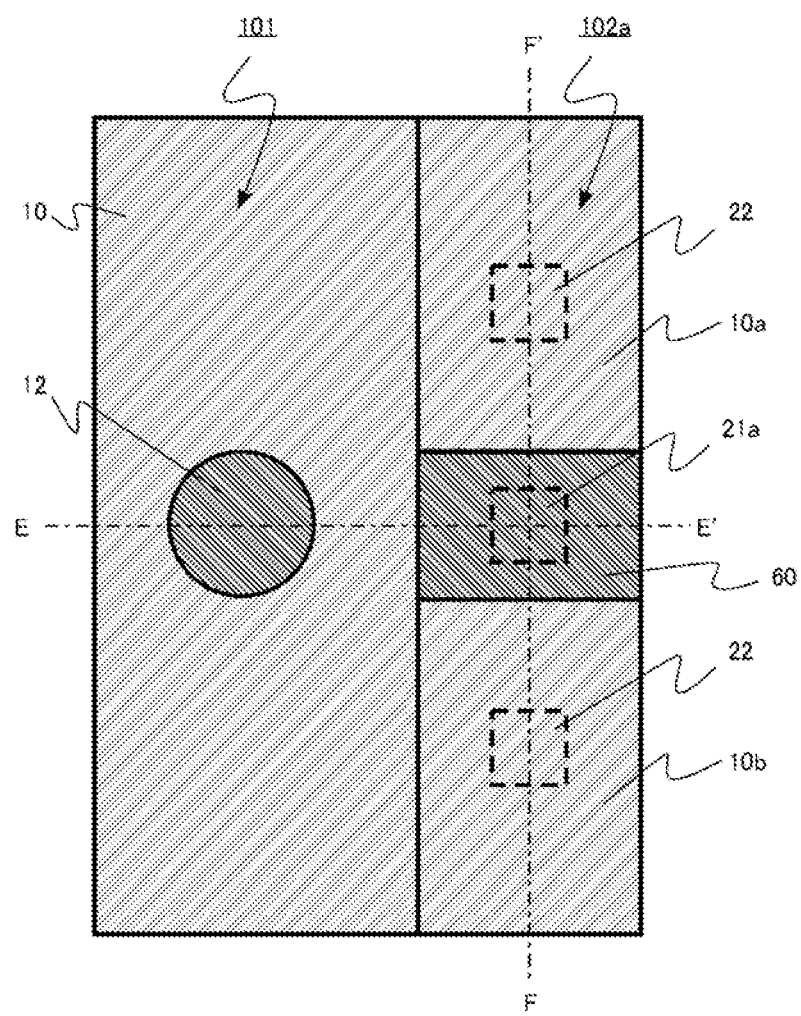
FIG. 24 is an enlarged schematic top view illustrating a part of the semiconductor device according to the third embodiment.

FIG. 24 is an enlarged schematic top view illustrating a part of the semiconductor device according to the third embodiment. FIG. 24 is an enlarged schematic top view of a region (P in FIG. 23) surrounded by the broken line in FIG. 23. FIG. 24 is a view corresponding to FIG. 2 of the first embodiment.

Figure 25A:
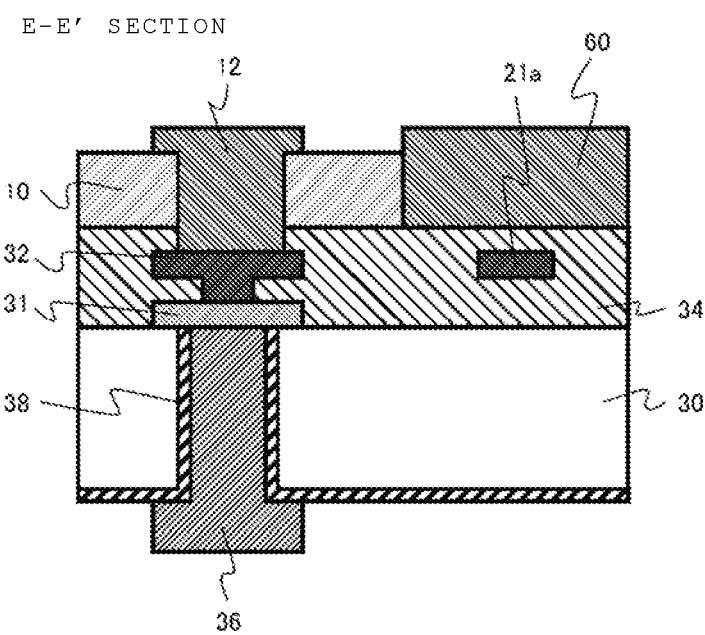
FIGS. 25A and 25B are enlarged schematic section views illustrating a part of the semiconductor device according to the third embodiment.
Figure 25B:
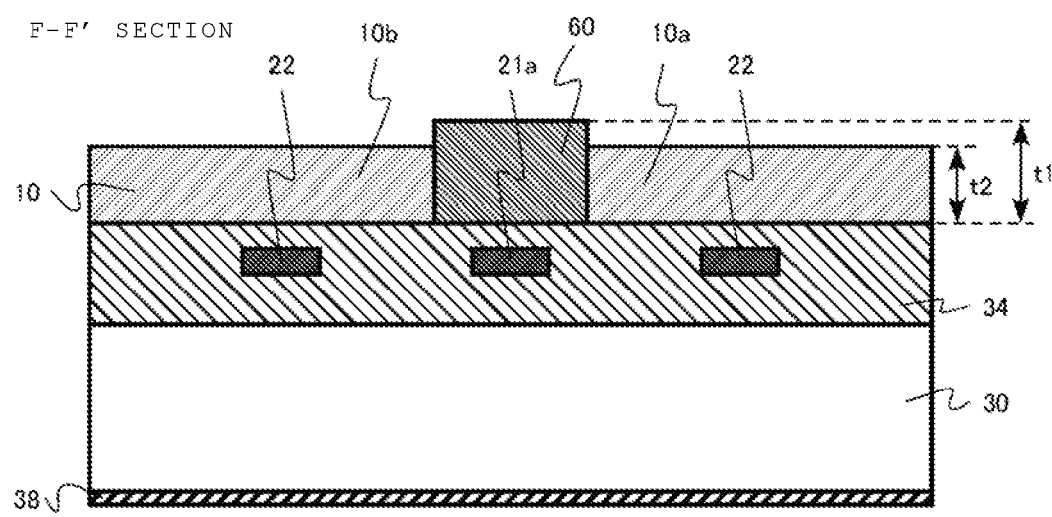

FIG. 25 are enlarged schematic sectional views illustrating a part of the semiconductor device according to the third embodiment. FIG. 25A is a section view taken along line E-E' in FIG. 24, and FIG. 25B is a section view taken along line F-F' in FIG. 24. FIGS. 25A and 25B are views corresponding to FIGS. 3A and 3B of the first embodiment.

A lithography mark 21a is provided between a first portion 10a and a second portion 10b of a protective resin film 10. A metal layer 60 is provided between the first portion 10a and the second portion 10b. The metal layer 60 is provided above the lithography mark 21a. Between the first portion 10a and the second portion 10b, for example, the metal layer 60 is embedded.

For example, a thickness (t1 in FIG. 25B) of the metal layer 60 is thicker than a thickness (t2 in FIG. 25B) of the protective resin film 10. An upper surface of the metal layer 60 protrudes from an upper surface of the protective resin film 10, for example.

For example, a material of the metal layer 60 is the same as that of a surface electrode 12. In other words, the material of the surface electrode 12 is the same as that of the metal layer 60.

For example, similarly to the lithography mark 21a, lithography marks 21c, 21e, and 21g are provided with the metal layer 60 thereabove. On the other hand, for example, the metal layer 60 is not provided above lithography marks 21b, 21d, and 21f. The metal layer 60 may be provided above all the lithography marks.

For example, the metal layer 60 can be formed simultaneously with forming of the surface electrode 12 at the time of forming the surface electrode 12 by opening a part of the resist pattern 52 (see FIG. 7) overlying lithographic mark 21a at the time of forming metal layer 60. In this case, the material of the metal layer 60 is the same as that of the surface electrode 12.

Further, for example, after the surface electrode 12 is formed, the metal layer 60 can also be formed separately from the surface electrode 12.

According to the semiconductor memory 300 of the third embodiment, the metal layer 60 is provided in a region where the protective resin film 10 does not exist, and thus a step due to the opening in the protective resin film 10 is eliminated. Accordingly, when an adhesive layer 54 is formed on the protective resin film 10, a cavity 94 is prevented from being formed inside the adhesive layer 54.

In general, adhesion between a metal material and a resin material is higher than adhesion between an insulating material such as an oxide film or a nitride film and a resin material. Accordingly, for example, in a case where an interlayer insulating layer 34 is an oxide film or a nitride film, the adhesion of the adhesive layer 54 to the wafer is improved to prevent the peeling of the adhesive layer 54 when the metal layer 60 is provided on the interlayer insulating layer 34.

In the semiconductor memory 300 of the third embodiment, the thickness (t1 in FIG. 25B) of the metal layer 60 is preferably thicker than the thickness (t2 in FIG. 25B) of the protective resin film 10. The step of the protective resin film 10 is completely eliminated and the cavity 94 is prevented from being formed inside the adhesive layer 54.

In addition, the material of the metal layer 60 is preferably equal to that of the surface electrode 12. An additional process of forming the metal layer 60 becomes unnecessary, and the manufacturing cost of the semiconductor memory 300 can be reduced.

As described above, according to the semiconductor memory 300 of the third embodiment, the protective resin film 10 is provided in a part of the dicing region 102, and thus a TSV 36 can be stably formed. Further, the metal layer 60 is provided in a region where the protective resin film 10 does not exist, and thus it is possible to further prevent the cavity 94 from being formed inside the adhesive layer 54 and to stably form the TSV 36.

In the first to third embodiments, the case is described as an example in which the semiconductor device is a semiconductor memory. In addition to such a semiconductor device, however, any other semiconductor device such as a logic device may be used as long as being a semiconductor device including the TSV.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a semiconductor substrate comprising a first device region, a second device region, and a cutting region extending between the first device region and the second device region;
a plurality of first lithography marks in the cutting region,
a plurality of second lithography marks in the cutting region;
a resin covering the first and second device regions and extending into portions of the cutting region with a gap formed therebetween over a central portion of the cutting region, wherein
the resin in the cutting region does not overlie the plurality of first lithography marks, and overlie the plurality of second lithography marks,
the resin in the cutting region includes a first portion and a second portion that extend from the first device region, the first portion overlying a first one of the plurality of second lithography marks, and the second portion being separated from the first portion and overlying a second one of the plurality of second lithography marks,
a side of the first portion facing the second device region is closer to the center of the cutting region than a side of the first one of the plurality of second lithography marks facing the second device region is, and
a side of the second portion facing the second device region is closer to the center of the cutting region than a side of the second one of the plurality of second lithography marks facing the second device region is.

2. The semiconductor device according to claim 1, wherein locations of the plurality of first lithography marks are offset from a center of the cutting region toward the first device region.

3. The semiconductor device according to claim 1, wherein
- the resin in the cutting region further includes a third portion and a fourth portion that extend from the second device region, the third portion overlying a third one of the plurality of second lithography marks, and the fourth portion being separated from the third portion and overlying a fourth one of the plurality of second lithography marks,
- a side of the third portion facing the first device region is closer to the center of the cutting region than a side of the third one of the plurality of second lithography marks facing the first device region is, and
- a side of the fourth portion facing the first device region is closer to the center of the cutting region than a side of the fourth one of the plurality of second lithography marks facing the first device region is.

4. The semiconductor device according to claim 1, further comprising:
- a metal contact extending through the semiconductor substrate in the first device region.

5. The semiconductor device according to claim 4, further comprising:
- a metal covering one of the plurality of first lithography marks, wherein the metal of the metal contact and the metal covering the one of the plurality of first lithography marks are the same metal.

* * * * *